(12) United States Patent
Chen et al.

(10) Patent No.: US 7,851,030 B2
(45) Date of Patent: Dec. 14, 2010

(54) METHOD OF REDUCING NUMBER OF PARTICLES ON LOW-K MATERIAL LAYER

(75) Inventors: Mei-Ling Chen, Kaohsiung (TW); Chih-Chien Liu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 1066 days.

(21) Appl. No.: 11/351,650

(22) Filed: Feb. 10, 2006

(65) Prior Publication Data

US 2006/0166011 A1     Jul. 27, 2006

Related U.S. Application Data

(63) Continuation-in-part of application No. 11/046,049, filed on Jan. 27, 2005, now abandoned.

(51) Int. Cl.
*H05H 1/24* (2006.01)
(52) U.S. Cl. .................. 427/569; 427/578; 427/579
(58) Field of Classification Search ............. 427/248.1, 427/569, 578, 579
See application file for complete search history.

(56) References Cited

U.S. PATENT DOCUMENTS

| 5,622,595 | A | * | 4/1997 | Gupta et al. | ................ | 438/710 |
|---|---|---|---|---|---|---|
| 5,843,239 | A | * | 12/1998 | Shrotriya | ................... | 134/1.1 |
| 6,340,843 | B1 | | 1/2002 | Usami | ...................... | 257/758 |
| 2002/0045966 | A1 | * | 4/2002 | Lee et al. | ................... | 700/121 |
| 2004/0099281 | A1 | * | 5/2004 | Rocha-Alvarez et al. | ..... | 134/1.1 |
| 2004/0155340 | A1 | * | 8/2004 | Owada et al. | .............. | 257/751 |
| 2005/0250348 | A1 | * | 11/2005 | Xia et al. | .................... | 438/788 |

* cited by examiner

*Primary Examiner*—Bret Chen
(74) *Attorney, Agent, or Firm*—J.C. Patents

(57) ABSTRACT

A method of reducing the number of particles on a low-k material layer is described. The low-k material layer is formed by a plasma enhanced chemical vapor deposition process, wherein a reaction gas, a cleaning gas, a high-frequency power and a low-frequency power are used. The method includes turning off the reaction gas and the low-frequency power after the low-k material layer is formed, and continuing to provide the cleaning gas during a delay time.

14 Claims, 1 Drawing Sheet

METHOD OF REDUCING NUMBER OF PARTICLES ON LOW-K MATERIAL LAYER

CROSS-REFERENCE TO RELATED APPLICATION

This application is a continuation-in-part application of a prior U.S. patent application Ser. No. 11/046,049, filed on Jan. 27, 2005 now abandoned. All disclosure is incorporated herewith by reference.

BACKGROUND OF THE INVENTION

1. Field of the Invention

The present invention generally relates to a method of forming a low-dielectric constant (low-k) material layer. More particularly, the present invention relates to a method of reducing the number of particles on a low-k material layer, and to a method of reducing simultaneously the number of particles on a low-k material layer and the fluorine concentration in the same, wherein the low-k material layer is formed in a PECVD chamber that is previously cleaned with a fluorine-containing etching gas. The present invention also relates to an integrated circuit (IC) device that includes a PECVD silicon-based low-k material layer having a fluorine concentration in the order of $10^5/cm^3$ or lower.

2. Description of Related Art

As the size of ultra-large scale integration (ULSI) devices continue to shrink, the RC-delay effect caused by the multi-level metal interconnect not only limits the high speed operation but also increases the power consumption to raise the temperature of the chips. Dielectric layers made from low-k material can be disposed between the metal interconnect layers to shorten the RC-delay time.

Nowadays, many low-k materials are formed through plasma-enhanced chemical vapor disposition (PECVE), including a material called HARD-CORAL, which uses tetramethyl-cyclotetrasiloxane (TMCTS) as reaction gas. After the low-k material layer reaches the pre-determined thickness and the source for the TMCTS gas is turned off, however, the remaining TMCTS gas would continue a deposition process, forming particles thereon. As a result, extra time and efforts are required to solve the particle issue before the mass production, thus the completion date of products will be affected.

In solution, a method to improve the particle issue of the low-k material layer. In the method, a reduced low frequency power (LF power) and a reduced high frequency power (HF power) are supplied during a delay time after the source of the reaction gas is turned off. Accordingly, the number of the particles will decrease.

FIG. 1 is the top view of a low-k material layer formed by the abovementioned deposition method. As shown in FIG. 1, though the number of the particles is reduced, the average particle number per unit area is still as many as 9697, which still affects the subsequent manufacturing process.

On the other hand, the oxide material previously deposited on the inner wall of the PECVD chamber is also a particle source, so that a fluorine-containing etching gas is usually introduced to generate plasma and remove the oxides on the chamber wall before the low-k material layer is deposited. However, after the deposition of the low-k material layer is finished, the fluorine residue of the etching gas remaining in the pipelines connecting with the chamber easily diffuse into the low-k material layer. Consequently, the interface property of the low-k material layer is degraded making the layer peel off easily, and copper atoms easily diffuse into the low-k material layer after a copper damascene structure is formed therein.

SUMMARY OF THE INVENTION

Accordingly, this invention is directed to a method of reducing the number of particles on a low-k material layer, thereby improving the film quality and overall yield.

This invention also provides a method of reducing simultaneously the number of particles on a low-k material layer and the fluorine concentration in the same.

This invention also provides an IC device that includes a PECVD silicon-based low-k material layer having a fluorine concentration in the order of $10^5/cm^3$ or lower.

In the method of reducing the number of particles on a low-k material layer according to this invention, the low-k material layer is formed through PECVD. Wherein, a reaction gas, a cleaning gas, a high frequency power and a low frequency power are used during the deposition process. The method includes turning off a source of the reaction gas and low-frequency power after the low-k material layer is formed, and continuing to provide the cleaning gas during a delay time.

According to an embodiment of this invention, the high-frequency power set during the delay time is equal to or lower than that during the deposition period of the low-k material layer. Alternatively, the high-frequency power is completely turned off and the pressure is reduced to achieve the same effect of reducing the particles.

According to an embodiment of this invention, the reaction gas comprises tetramethyl-cyclotetrasiloxane.

By applying the method of this invention, the number of particles on the low-k material layer can be reduced, the quality of the low-k material layer is improved, and the product yield is increased.

Moreover, the method of reducing simultaneously the number of particles on a low-k material layer and the fluorine concentration in the same of this invention is suitably applied to a case where the PECVD chamber is previously cleaned using a fluorine-containing etching gas. Similarly, a reaction gas, a cleaning gas, a high-frequency power and a low-frequency power are used during the PECVD process. After the low-k material layer is formed, the source of the reaction gas is turned off, the low-frequency power is lowered or turned off, and the cleaning gas is continued to provide during a delay time or a pump-down step. During the delay time or the pump-down step, the cleaning gas diverts the reaction gas and the etching gas remaining in the pipelines connected with the chamber.

Since the cleaning gas can divert the reaction gas and the fluorine-containing etching gas remaining in the pipelines connected with the chamber during the delay time or the pump-down step, the number of particles on the low-k material layer and the fluorine concentration in the same can be reduced simultaneously in a case where the chamber is previously cleaned using a fluorine-containing etching gas. Therefore, the interface property of the low-k material layer is not degraded making the layer peel off easily, and copper atoms do not easily diffuse into the low-k material layer after a copper damascene structure is formed therein.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
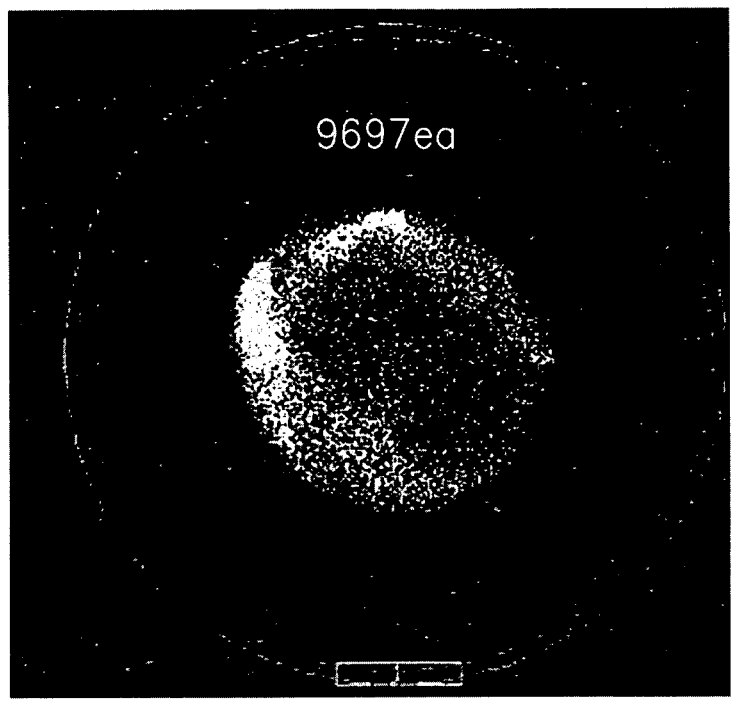
FIG. 1 is the top view of a low-k material layer that is formed with a conventional deposition process.

Reference will now be made in detail to the present embodiments of the invention, examples of which are illustrated in the accompanying drawings. Wherever possible, the same reference numbers are used in the drawings and the description to refer to the same or like parts.

In this embodiment, the low-k material to be deposited through PECVD can be a silicon-based low-k material like carbon-doped silicon oxide (CDO). For a chamber used to deposit a silicon-based low-k material, the plasma generated from a fluorine-containing etching gas can effectively clean the material deposited on its inner wall in previous use, wherein the fluorine-containing etching gas may include at least one of $NF_3$, $C_2F_6$, $CHF_3$ and $CF_4$. When CDO as is to be deposited, the reaction gas in the present embodiment is tetramethyl-cyclotetrasiloxane (TMCTS), which may be supplied from a liquid TMCTS system through gasification. The flow rate of TMCTS for the normal deposition period is about 1.5-6.5 sccm.

The cleaning gas used herein is, for example, carbon dioxide. In fact, the cleaning gas may be selected from the group consisting of oxygen-containing gases, nitrogen-containing gases, inert gases, hydrogen-containing gases and combinations thereof, wherein the oxygen-containing gases include $CO_2$, $O_2$ and CO, etc., the nitrogen-containing gases include $N_2$, $N_2O$ and $NH_3$, etc., the inert gases include He and Ar, etc., and the hydrogen-containing gases include $H_2$, etc. During the normal deposition period, the flow rate of the cleaning gas is about 3,000-12,000 sccm, the high-frequency power is no higher than 3000 W, and the temperature for the PECVD process is usually 250-450° C. When gaseous TMCTS is used as the reaction gas to deposit CDO, the high-frequency power is in the range of 700-1,500 W, the low frequency power is under 800 W with the frequency in the range of 350-450 Hz, the temperature for the PECVD process is 350-450° C., and the operation pressure is in the range of about 2.5-5 Torr.

After the low-k material layer reaches a pre-determined thickness, the reaction gas source is turned off and the low frequency power is lowered or turned off, but the cleaning gas is provided during a delay time or a pump-down step. The delay time or the period of the pump-down step is, for example, 1 to 15 seconds, and the high-frequency power during the delay time or the pump-down step is equal to or lower than that during the deposition of the low-k material layer. That is, the high-frequency power does not exceed 3000 W. Alternatively, the high-frequency power and the low-frequency power both are turned off and the pressure in the chamber is reduced during the delay time, which can also reduce the number of particles. In addition, the flow rate of the cleaning gas during the delay time or the pump-down step is usually about 500-29000 sccm, preferably about 500-15000 sccm and more preferably about 5000-10000 sccm. The pressure in the chamber in the delay time or the pump-down step is no higher than 10 Torr.

Figure 2:
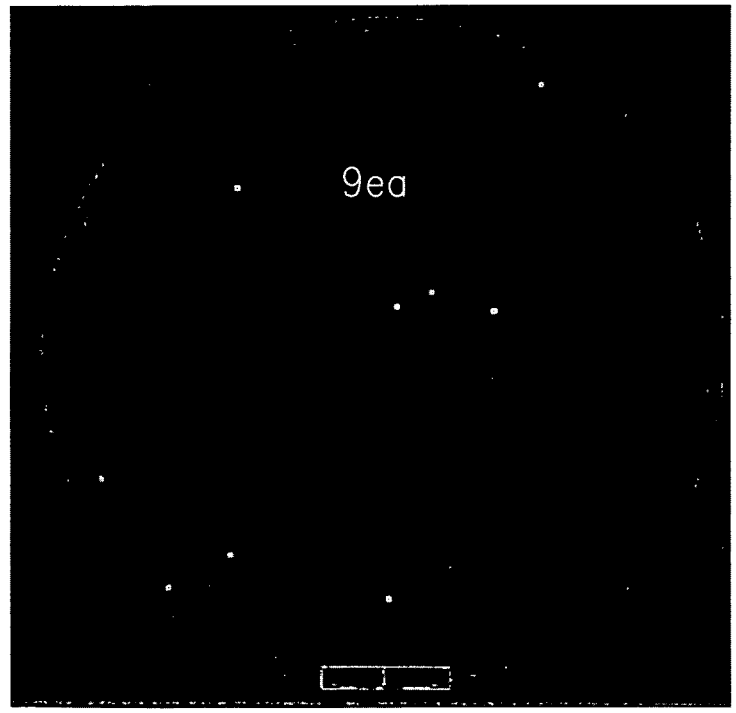
FIG. 2 is the top view of a low-k material layer formed with a deposition process according to one embodiment of this invention.

FIG. 2 is a top view of a low-k material layer formed with TMCTS in a PECVD process according to an embodiment of this invention; after the deposition, the low-frequency power is turned off. It is obvious from FIG. 2 that the preset invention can effectively reduce the number of particles, so only 9 particles are seen on the low-k material layer.

It is also known from other measurements that the fluorine concentration in a CDO layer as a PECVD silicon-based low-k material layer can be reduced to the order of $10^5/cm^3$ or lower. That is, the target IC device can be formed with a CDO layer as a PECVD silicon-based low-k layer having a fluorine concentration in the order of $10^5/cm^3$ or lower. Usually, the fluorine concentration in a CDO layer formed as above is in the order of $10^5/cm^3$ to $10^4/cm^3$.

As mentioned above, the method of this invention can reduce the number of particle on the low-k material layer, so that the film quality can be greatly improved, and the yield can be increased.

In addition, by applying the above method of this invention to a case where the PECVD chamber is previously cleaned using a fluorine-containing etching gas, the number of particles on the low-k material layer and the fluorine concentration in the same can be reduced simultaneously because the cleaning gas can divert the reaction gas and the fluorine-containing etching gas remaining in the pipelines connected with the chamber. Thereby, an IC device having a PECVD silicon-based low-k material layer with a fluorine concentration in the order of $10^5/cm^3$ or lower can be obtained, wherein the low-k material layer does not peel off easily or suffer from copper diffusion due to the low fluorine concentration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reducing simultaneously a number of particles on a low-k material layer and a fluorine concentration in the low-k material layer, the low-k material layer being formed using a reaction gas, a high-frequency power, a low-frequency power and a cleaning gas in a PECVD process that utilizes a chamber previously cleaned with a fluorine-containing etching gas, and the method comprising:

turning off a source of the reaction gas, the low-frequency power and the high-frequency power after the low-k material layer is formed, and continuing to supply the cleaning gas during a pump-down step, wherein a pressure during the pump-down step does not exceed 10 Torr.

2. The method of claim 1, wherein the high-frequency power set during the pump-down step is equal to or lower than the high-frequency power set during the deposition of the low-k material layer.

3. The method of claim 1, wherein the cleaning gas is selected from the group consisting of oxygen-containing gases, nitrogen-containing gases, inert gases, hydrogen-containing gases and combinations thereof, the oxygen-containing gases include $CO_2$, $O_2$ and CO, the nitrogen-containing gases include $N_2$, $N_2O$ and $NH_3$, the inert gases include He and Ar, and the hydrogen-containing gases include $H_2$.

4. The method of claim 1, wherein the fluorine-containing etching gas comprises at least one of $NF_3$, $C_2F_6$, $CHF_3$ and $CF_4$.

5. The method of claim 1, wherein the low-k material layer comprises carbon-doped silicon oxide (CDO).

6. The method of claim 5, wherein the reaction gas comprises tetramethyl-cyclotetrasiloxane (TMCTS).

7. The method of claim 6, wherein the reaction gas is supplied from a liquid TMCTS system through gasification.

8. The method of claim 1, wherein a period of the pump-down step is about 1-15 seconds.

9. The method of claim 1, wherein a flow rate of the cleaning gas during the pump-down step is about 500-29000 sccm.

10. The method of claim 9, wherein the flow rate of the cleaning gas during the pump-down step is about 500-15000 sccm.

11. The method of claim 10, wherein the flow rate of the cleaning gas during the pump-down step is about 5000-10000 sccm.

12. The method of claim 1, wherein the high-frequency power is set no higher than 3000 W during the pump-down step.

13. The method of claim 1, wherein a temperature during the deposition of the low-k material layer is about 250-450° C.

14. A method of reducing simultaneously a number of particles on a low-k material layer and a fluorine concentration in the low-k material layer, the low-k material layer being formed using a reaction gas, a high-frequency power, a low-frequency power and a cleaning gas in a PECVD process that utilizes a chamber previously cleaned with a fluorine-containing etching gas, and the method comprising:

turning off a source of the reaction gas, the low-frequency power and the high-frequency power after the low-k material layer is formed, and continuing to supply the cleaning gas and reducing a pressure in the chamber during a delay time.

* * * * *